United States Patent
Matsumoto et al.

(10) Patent No.: US 8,115,520 B2
(45) Date of Patent: Feb. 14, 2012

(54) DRIVER CIRCUIT

(75) Inventors: Naoki Matsumoto, Tokyo (JP); Takashi Sekino, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 12/583,450

(22) Filed: Aug. 20, 2009

(65) Prior Publication Data

US 2010/0060325 A1  Mar. 11, 2010

Related U.S. Application Data (63) Continuation of application No. PCT/JP2008/052635, filed on Feb. 18, 2008.

(30) Foreign Application Priority Data

Feb. 27, 2007  (JP) .................................. 2007-047470

(51) Int. Cl.
 *H03K 3/00* (2006.01)
(52) U.S. Cl. ........... 327/108; 327/361; 327/407; 326/82
(58) Field of Classification Search ........................ None
 See application file for complete search history.

(56) References Cited

U.S. PATENT DOCUMENTS

| | | | |
|---|---|---|---|
| 4,430,626 A * | 2/1984 | Adams | 331/108 B |
| 5,898,326 A | 4/1999 | Okayasu | |
| 6,360,180 B1 | 3/2002 | Breger | |
| 6,956,908 B2 * | 10/2005 | Forbes | 375/283 |
| 7,750,740 B2 * | 7/2010 | Inoue | 330/295 |
| 7,990,177 B2 * | 8/2011 | Matsumoto et al. | 326/82 |
| 2006/0280239 A1 | 12/2006 | Moll et al. | |
| 2007/0103198 A1 | 5/2007 | Matsumoto et al. | |
| 2007/0230355 A1 | 10/2007 | Ueda | |
| 2008/0239966 A1 | 10/2008 | Ueda | |

FOREIGN PATENT DOCUMENTS

| | | |
|---|---|---|
| JP | 10-190747 | 7/1998 |
| JP | 2002-544489 | 12/2002 |
| JP | 2004-172660 | 6/2004 |
| JP | 2006-345532 | 12/2006 |
| WO | WO 2007/049674 | 5/2007 |
| WO | WO 2007/116765 | 10/2007 |

* cited by examiner

*Primary Examiner* — An Luu
(74) *Attorney, Agent, or Firm* — Muramatsu & Associates (57) ABSTRACT

A driver circuit includes a main driver which receives an input signal and outputs a first signal corresponding to the input signal, a sub driver which receives the input signal and outputs a non-inverted signal and an inverted signal corresponding to the input signal, a differentiating circuit including resistors and a variable capacity condenser, which outputs signals by differentiating the non-inverted signal and the inverted signal, respectively, and an addition unit which outputs a high frequency emphasized signal given by adding the output signal of the main driver and the signal given by differentiating the non-inverted signal, or a low frequency emphasized signal given by adding the output signal of the main driver and the signal given by differentiating the inverted signal.

6 Claims, 7 Drawing Sheets

POINT A, POINT B

FIG. 3B

POINT C2

FIG. 3C

POINT D2

FIG. 3D

POINT E2

FIG. 3E

POINT F

DRIVER CIRCUIT

This application is a continuation of prior International Patent Application No. PCT/JP2008/052635 filed Feb. 18, 2008 which claims the benefit of Japanese Patent Application No. 2007-047470 filed Feb. 27, 2007, the entire contents of which are incorporated herein by reference.

TECHNICAL FIELD

The present invention relates to a driver circuit for supplying signals to a circuit connected to the driver circuit.

BACKGROUND ART

The semiconductor test device is a device which tests the operation of a device under test (hereinafter called DUT) by inputting signals of prescribed pattern data to the DUT, reading output data of the DUT resultant of waveforms of the input signals, and comparing the output data with the expected data.

Recently, as the transfer bit rate of CPU, MPU, memories, etc. increases, it becomes necessary to compensate the transmission loss at connections between respective LSIs. Usually, the transmission line has integration characteristics, and thus, the high frequency component of a signal is lost. To cope with such a problem, a high frequency emphasizing circuit for compensating the transmission loss is often provided in an LSI.

The LSI incorporating such a high frequency emphasizing circuit must be tested as to whether or not the high frequency emphasizing circuit operates correctly.

DISCLOSURE OF THE INVENTION

Problems to be Solved by the Invention

The semiconductor test device which tests the high frequency emphasizing circuit incorporated in a DUT for compensating a transmission loss preferably can generate signals simulating signals having transmission losses under arbitrary loss conditions and test various DUTs.

The semiconductor test device is required also to generate as signals to be supplied to a DUT high frequency emphasized signals. For example, the drive circuit of the semiconductor test device is required to generate high frequency emphasized signals in which a loss of signals in the transmission line compensated in advance.

The signals simulating signals having transmission losses, i.e., the low frequency emphasized signals and the high frequency emphasized signals can be realized by the use of an RC differentiating circuit or an RC integrating circuit which comprises a resistor and a condenser.

However, it is difficult to simulate arbitrary transmission losses by simulating transmission losses by the simply constituted differentiating circuit or the simply constituted integrating circuit. Otherwise, it makes the circuit complicated and large.

An object of the present invention is to provide a driver circuit which does not require a complicated and large circuit structure but has a simple circuit structure, can generate required high frequency emphasized signals and low frequency emphasized signals and can simulate arbitrary transmission losses.

Means for Solving the Problems

The above-described object is attained by a driver circuit for outputting an output signal of a waveform corresponding to an input signal, the driver circuit comprising: a main driver which receives the input signal and outputs a first signal corresponding to the input signal; a sub driver which receives the input signal and outputs a second signal corresponding to the input signal; a differentiating circuit including a resistor and a variable capacity condenser, which outputs a third signal produced by differentiating the second signal; and an addition unit which outputs the output signal by adding the first signal and the third signal.

The above-described object is attained by a driver circuit for outputting an output signal of a waveform corresponding to an input signal, the driver circuit comprising: a main driver which receives the input signal and outputs a first signal corresponding to the input signal; a sub driver which receives the input signal and outputs a differential signal of a second signal corresponding to the input signal and a third signal produced by inverting the input signal; a differentiating circuit including a resistor and a variable capacity condenser, which outputs a fourth signal produced by differentiating the second signal and outputs a fifth signal produced by differentiating the third signal; and an addition unit which outputs as the output signal a high frequency emphasized signal by adding the first signal and the fourth signal, or a low frequency emphasized signal by adding the first signal and the fifth signal.

It is possible that the variable capacity condenser is a transistor.

It is possible that the variable capacity condenser is a diode.

Effect of the Invention

According to the present invention, a driver circuit for outputting an output signal of a waveform corresponding to an input signal, the driver circuit comprising: a main driver which receives the input signal and outputs a first signal corresponding to the input signal; a sub driver which receives the input signal and outputs a second signal corresponding to the input signal; a differentiating circuit including a resistor and a variable capacity condenser, which outputs a third signal produced by differentiating the input signal; and an addition unit which outputs the output signal by adding the first signal and the third signal, whereby by the simple circuit structure without the need of a complicated and large circuit structure, required high frequency emphasized signals and required low frequency emphasized signals can be generated, and arbitrary transmission losses can be simulated.

REFERENCE NUMBERS

10 . . . driver circuit
12 . . . signal generating circuit
14 . . . main driver
16 . . . sub driver
18 . . . non-inverted signal high frequency emphasizing circuit
20 . . . inverted signal high frequency emphasizing circuit
22, 24 . . . multiplying circuit
26 . . . addition unit
28, 30 . . . resistor
32 . . . variable capacity condenser
34, 36 . . . resistor
38 . . . variable capacity condenser
33 . . . condenser
39 . . . condenser
44 . . . driver circuit
46, 48, 50, 52 . . . transistor
54, 56 . . . resistor
58 . . . constant current circuit
60, 62 . . . transistor
64, 66 . . . constant current circuit
68, 70, 72, 74 . . . transistor
76, 78 . . . drive power source
80, 82 . . . variable capacity diode
84, 86 . . . transistor

BEST MODE FOR CARRYING OUT THE INVENTION

First Embodiment

Figure 1:
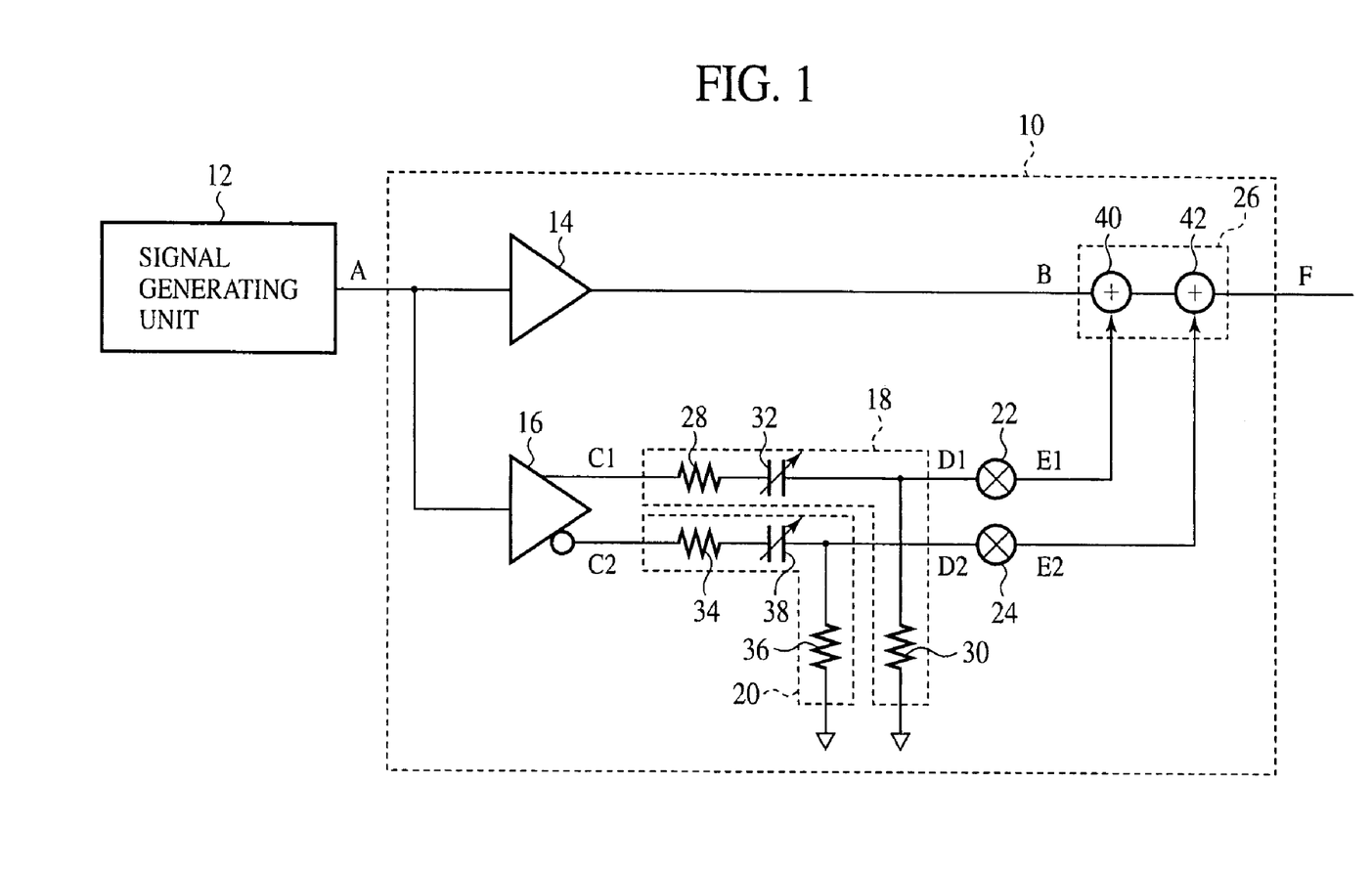
FIG. 1 is a block diagram illustrating the structure of the driver circuit according to an embodiment of the present invention.
Figure 4:
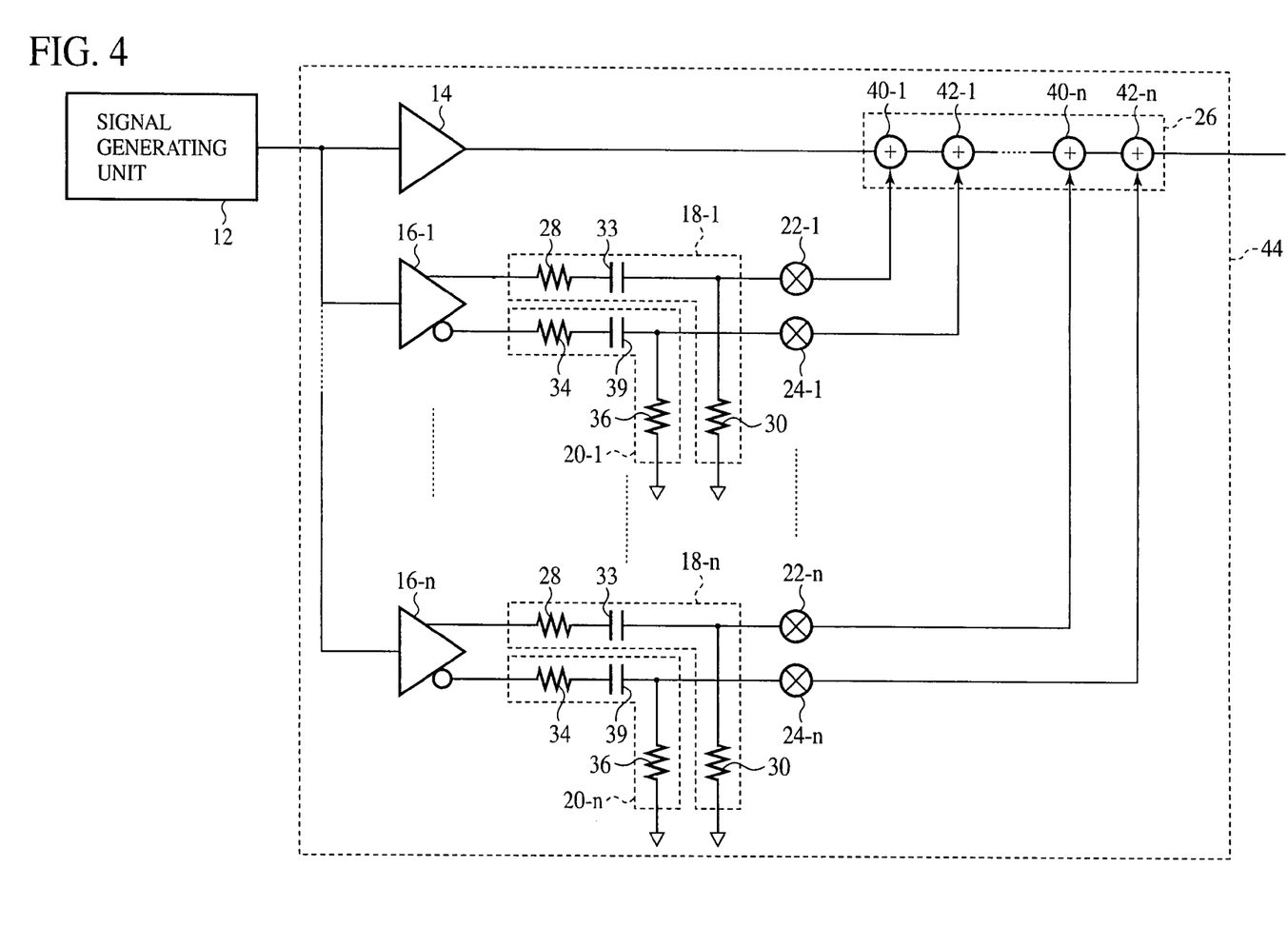
FIG. 4 is a view explaining demerits of the RC differentiating circuit forming a non-inverted signal high frequency emphasizing circuit and an inverted signal high frequency emphasizing circuit, which uses an usual a fixed capacity condenser rather than a variable capacity condenser.
Figure 5:
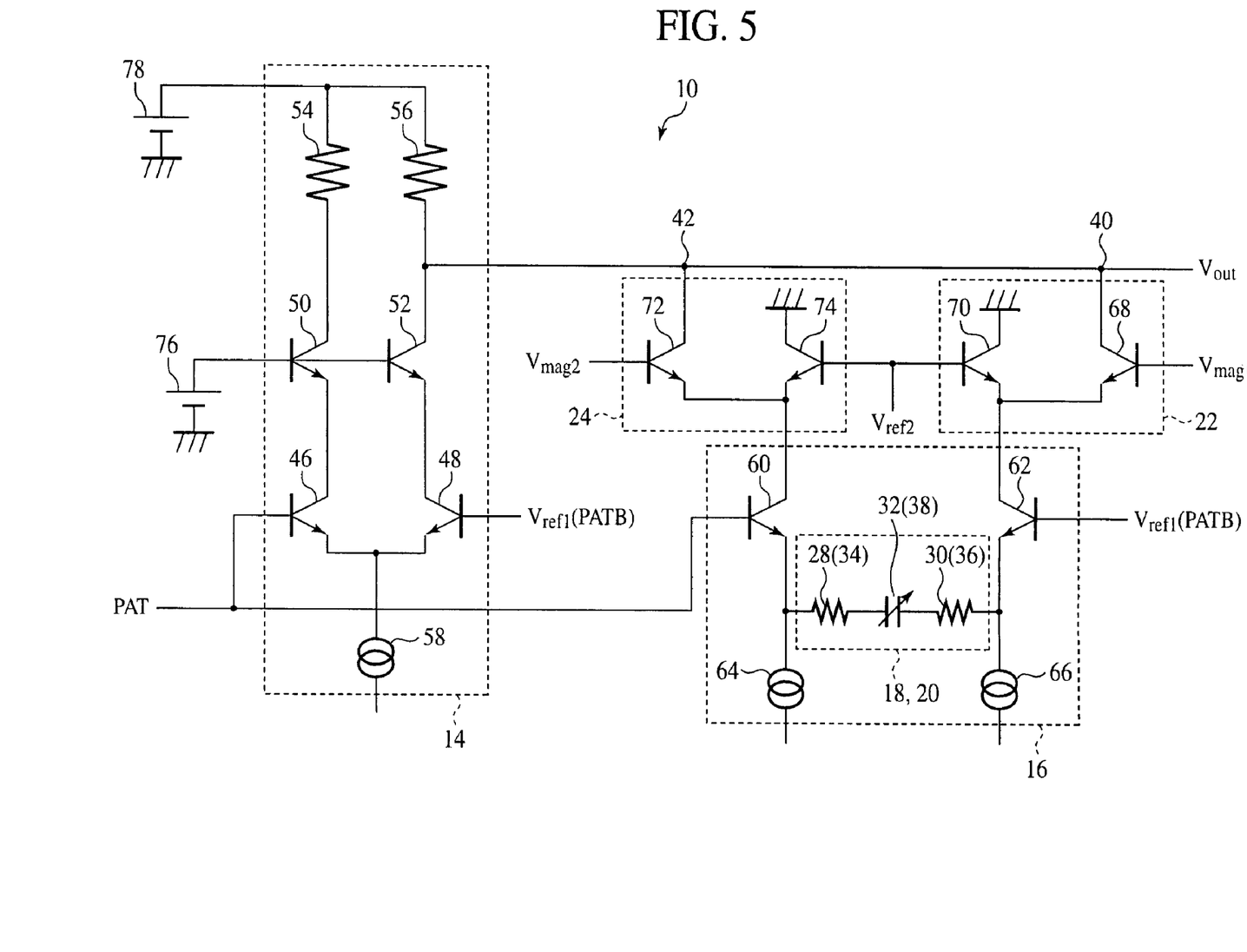
FIG. 5 is a circuit diagram illustrating an example of a circuit structure of the driver circuit according to the embodiment of the present invention.
Figure 6:
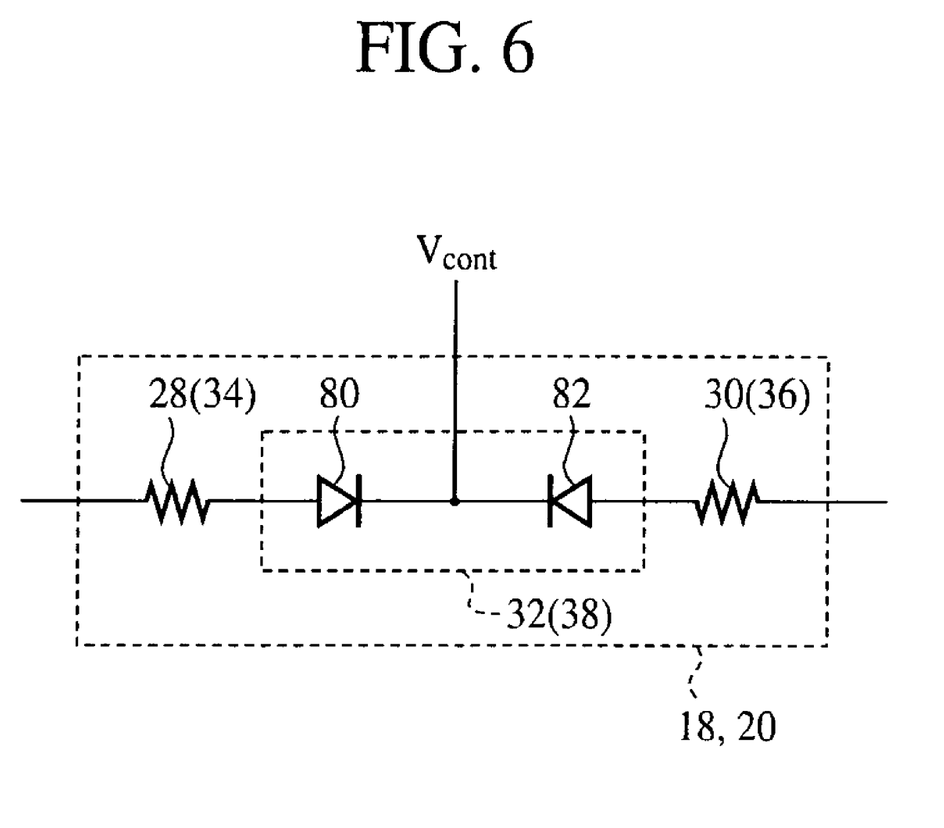
FIG. 6 is a circuit diagram illustrating the structure of an RC differentiating circuit in the driver circuit according to the embodiment of the present invention, which is common between the non-inverted signal high frequency emphasizing circuit and the inverted signal high frequency emphasizing circuit.

The drive circuit according to an embodiment of the present invention will be explained with reference to FIGS. 1 to 6. FIG. 1 is a block diagram illustrating the structure of the driver circuit according to the present embodiment. FIGS. 2 and 3 show waveforms of the signals at points of the driver circuit according to the present embodiment. FIG. 4 is a view explaining demerits of an RC differentiating circuit constituting a non-inverted high frequency emphasizing circuit and an inverted high frequency emphasizing circuit, which uses a fixed capacity condenser rather than a variable capacity condenser. FIG. 5 is a circuit diagram illustrating an example of a circuit structure of the driver circuit according to the present embodiment. FIG. 6 is a circuit diagram illustrating the structure of an RC differentiating circuit in the driver circuit according to the present embodiment, which is common between the non-inverted signal high frequency emphasizing circuit and the inverted signal high frequency emphasizing circuit.

The driver circuit 10 according to the present embodiment is incorporated in a semiconductor test device. The driver circuit 10 receives an input signal from a signal generating unit 12, generates a high frequency emphasized signal having the high frequency emphasized or a low frequency emphasized signal having the low frequency emphasized, i.e., a signal simulating a transmission loss and supplies the generated signal to a DUT. By the low frequency emphasized signal, the high frequency emphasizing circuit incorporated in the DUT for compensating transmission losses can be tested.

As illustrated in FIG. 1, the driver circuit 10 according to the present embodiment comprises a main driver 14, a sub driver 16, a non-inverted signal high frequency emphasizing circuit 18, an inverted signal high frequency emphasizing circuit 20, two multiplication circuits 22, 24 respectively provided for the non-inverted signal high frequency circuit 18 and the inverted high frequency emphasizing circuit 20, and an addition unit 26.

To the main driver 14, a signal of a prescribed waveform generated by the signal generating unit 12 is supplied as an input signal. The signal generating unit 12 generates, for example, a rectangular pulse signal of a prescribed pulse width and amplitude.

The main driver 14 receives an input signal from the signal generating unit 12 and outputs an outputs signal of the same waveform as that of the input signal.

The sub driver 16 comprises a differential driver, and receives an input signal a signal from the signal generating unit 12 and outputs a differential signal of a non-inverted signal of the same waveform as that of the input signal and an inverted signal of the inverted waveform of the input signal.

The non-inverted high frequency emphasizing circuit 18 is an RC differentiating circuit comprising resistors 28, 30 and a variable capacity condenser 32. The non-inverted signal high frequency emphasizing circuit 18 generates a signal having the high frequency of the non-inverted signal emphasized, which is to be added to an output signal of the main driver 14 in the high frequency emphasizing operation for generating a high frequency emphasized signal as an output signal of the driver circuit 10. That is, the non-inverted signal high frequency emphasizing circuit 18 receives an input signal which is a non-inverted signal of differential signals from the sub driver 16, passes the high frequency component of the input signal and outputs a signal having the high frequency of the input signal emphasized, i.e., a differential signal of the input signal.

The inverted signal high frequency emphasizing circuit 20 is an RC differentiating circuit comprising the resistors 34, and the variable capacity condenser 38. The inverted signal high frequency emphasizing circuit 20 generates a signal given by emphasizing the high frequency of an inverted signal, which is to be added to an output signal of the main driver 14 in the low frequency emphasizing operation for generating a low frequency emphasized signal as an output signal of the driver circuit 10. That is, the inverted signal high frequency emphasizing circuit 20 receives an input signal which is an inverted signal of differential signals from the sub driver 16, passes the high frequency component of the input signal and outputs a signal having the high frequency of the input signal emphasized, i.e., a differential signal of the input signal.

The multiplying circuit 22 receives an input signal from the associated non-inverted signal high frequency emphasizing circuit 18 and outputs a signal whose amplitude is adjusted by multiplying the input signal with a prescribed correction value.

The multiplying circuit 24 receives an input signal from the associated inverted signal high frequency emphasizing circuit 20 and outputs a signal whose amplitude is adjusted by multiplying the input signal with a prescribed correction value.

The addition unit 26 includes two addition circuits 40, 42 respectively associated with the two multiplying circuits 22, 24.

The addition circuit 40 receives an output signal of the main driver 14 and an output signal of the associated multiplying circuit 22 in the high frequency emphasizing operation and outputs a signal which is resulted from adding an output signal of the non-inverted high frequency emphasizing circuit 18 having the amplitude adjusted by the multiplying circuit 22 to the output signal of the main driver 14.

The addition circuit 42 receives an output signal of the main driver 14 and an output signal of the associated multiplying circuit 24 in the low frequency emphasizing operation and outputs a signal which is resulted from adding an output signal of the inverted signal high frequency emphasizing circuit 10 having the amplitude adjusted by the multiplying circuit 24 to the output signal of the main driver 14.

Thus, the addition unit 26 generates an output signal of the addition circuit 40 in the high frequency emphasizing operation and generates an output signal of the addition circuit 42 in the low frequency emphasizing operation.

The output signals of the addition unit 26 are inputted to a DUT, and the DUT is tested.

The driver circuit 10 according to the present invention selectively conducts the high frequency emphasizing operation in which a high frequency emphasized signal is generated and the low frequency emphasizing operation in which a low frequency emphasized signal is generated.

In the high frequency emphasizing operation, a high frequency emphasized signal is generated which is a resultant of adding an output signal of the non-inverted signal high frequency emphasizing circuit 18 having the amplitude adjusted by the multiplying circuit 22 to an output signal of the main driver 14.

FIG. 2 is a view of the waveforms of the signals at the respective points of the driver circuit 10 according to the present embodiment in the high frequency emphasizing operation and illustrates the waveforms of the signals at Point A, Point B, Point C1, Point D1, Point E1 and Point F of the circuit structure illustrated in FIG. 1. FIG. 2A illustrates the waveform of the signal generated by the signal generating unit 12 (the signal at Point A) and the output signal of the main driver 14 (the signal Point B). FIG. 2B illustrates the waveform of the non-inverted signal (the signal at Point C1) of the differential signals outputted by the sub driver 16. FIG. 2C is the waveform of the output signal of the non-inverted signal high frequency emphasizing circuit 18 (the signal at Point D1). FIG. 2D illustrates the waveform of the output signal of the multiplying circuit 22 (the signal at Point E1). FIG. 2E illustrates the waveform of the output signal of the addition unit 26 (the signal at Point F).

Figure 2A:
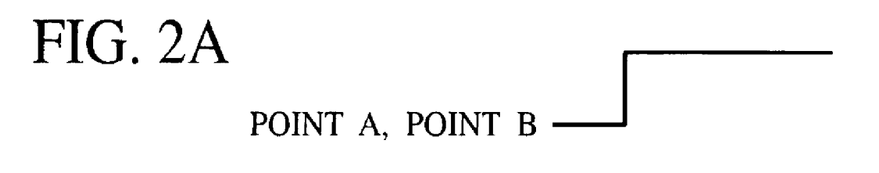
FIG. 2 is a waveform view (Part 1) of the waveforms of signals at points of the driver circuit according to the embodiment of the present invention.

As illustrated in FIG. 2A, the output signal of the main driver 14 is a signal of the same waveform as that of the signal generated by the signal generating unit 12.

Figure 2B:
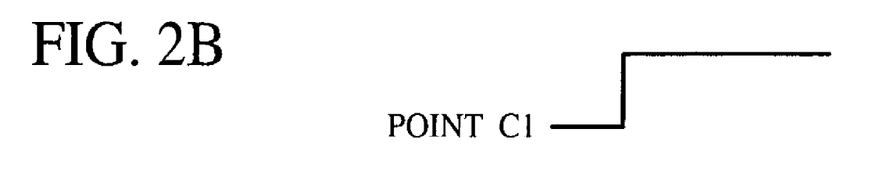

As illustrated in FIG. 2B, the non-inverted signal of the differential signals outputted by the sub driver 16 is a signal of the same waveform as that of the signal generated by the signal generating unit 12.

Figure 2C:
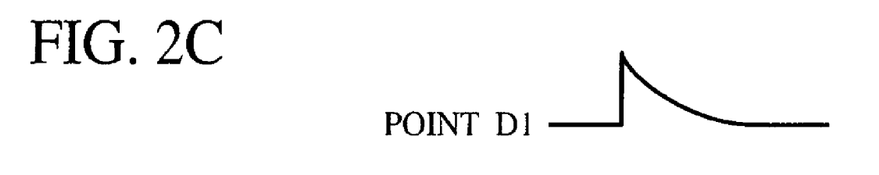

As illustrated in FIG. 2C, the output signal of the non-inverted signal high frequency emphasizing circuit 18 is a differential signal having the high frequency of the non-inverted signal of the sub driver 16 illustrated in FIG. 2B emphasized. The differential signal to be outputted by the non-inverted signal high frequency emphasizing circuit 18 can be shaped into an arbitrary waveform by controlling the capacity of the variable capacity condenser 32.

Figure 2D:
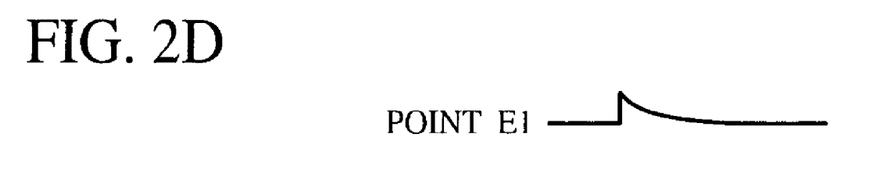

As illustrated in FIG. 2D, the output signal of the multiplying circuit 22 is a signal of the waveform given by adjusting by, e.g., ½ the output signal of the non-inverted high frequency circuit 18 illustrated in FIG. 2C.

Figure 2E:
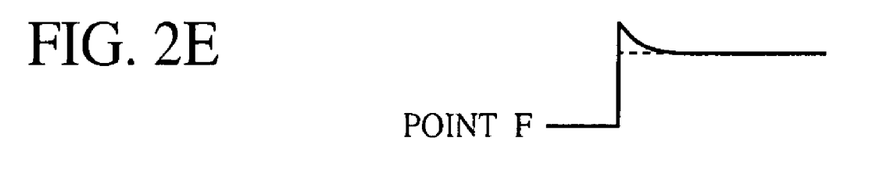

As illustrated in FIG. 2E, the output signal of the addition unit 26 is a signal of the waveform resulted from adding by the addition circuit 40 the output signal of the non-inverted signal high frequency emphasizing circuit 18 having the amplitude adjusted by, e.g., ½ illustrated in FIG. 2D to the output signal of the main driver 14 illustrated in FIG. 2A. Thus, the driver circuit 10 according to the present embodiment, in the high frequency emphasizing operation, adds the output signal of the non-inverted signal high frequency emphasizing circuit 18 having the amplitude adjusted by the multiplying circuit 22 to the output signal of the main driver 14, thereby generating the high frequency emphasized signal of the waveform of the output signal of the main driver 14 where an amplitude of the edge is increased.

In the low frequency emphasizing operation, the low frequency emphasized signal produced by adding the output signal of the inverted signal high frequency emphasizing circuit 20 having the amplitude adjusted by the multiplying circuit 24 to the output signal of the main driver 14 is generated, i.e., the signal simulating a transmission loss.

FIG. 3 is a view of the waveforms of the signals at respective points of the driver circuit according to the present embodiment in the low frequency emphasizing operation and illustrates the waveforms of the signals at Point A, Point B, Point C2, Point D2, Point E2 and Point F of the circuit structure illustrated in FIG. 1. FIG. 3A illustrates the waveform of the signal generated by the signal generating unit 12 (the signal at Point A) and the output signal of the main driver 14 (the signal at Point B). FIG. 3B illustrates the waveform of the inverted signal (the signal at Point C2) of the differential signals outputted by the sub driver 16. FIG. 3C illustrates the waveform of the output signal of the inverted signal high frequency emphasizing circuit 20 (the signal at Point D2). FIG. 3D illustrates the waveform of the output signal of the multiplying circuit (the signal at Point E2). FIG. 3E illustrates the waveform of the output signal of the addition unit 26 (the signal at Point F).

Figure 3A:
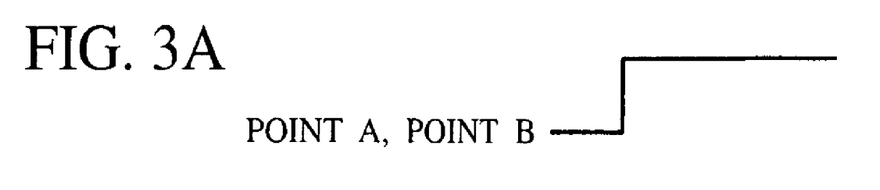
FIG. 3 a waveform view (Part 2) of the waveforms of signals at points of the driver circuit according to the embodiment of the present invention.

As illustrated in FIG. 3A, the output signal of the main driver 14 is a signal of the same waveform as that of the signal generated by the signal generating unit 12.

Figure 3B:
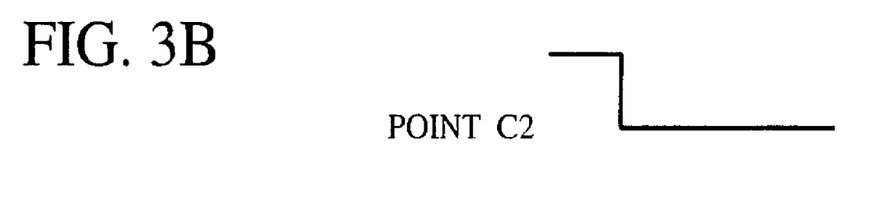

As illustrated in FIG. 3B, the inverted signal of the differential signals outputted by the sub driver 16 is a signal of the inverted waveform of the signal generated by the signal generating unit 12.

Figure 3C:
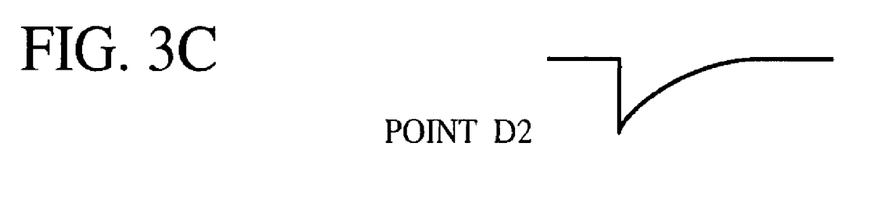

As illustrated in FIG. 3C, the output signal of the inverted signal high frequency emphasizing circuit 20 is a differential signal given by emphasizing the high frequency of the inverted signal of the sub driver 16 emphasized. The differential signal to be outputted from the inverted signal high frequency emphasizing circuit 20 can be shaped into an arbitrary waveform by controlling the capacity of the variable capacity condenser 38.

Figure 3D:
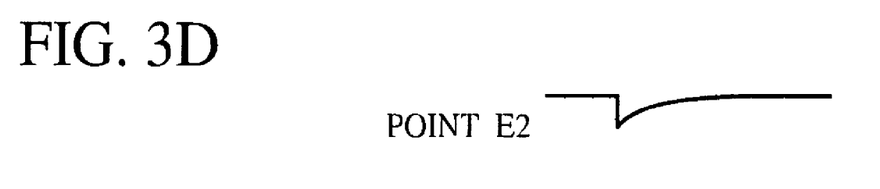

As illustrated in FIG. 3D, the output signal of the multiplying circuit 24 is a signal given by adjusting by, e.g., ½ the amplitude of the output signal of the inverted signal high frequency emphasizing circuit 20.

Figure 3E:
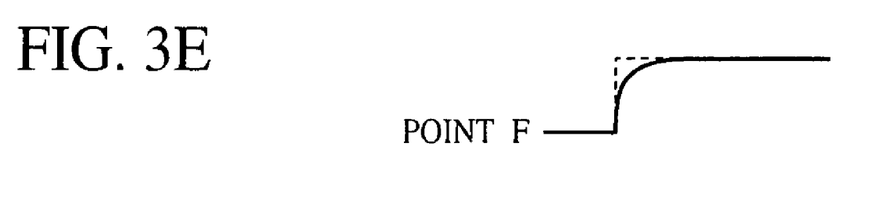

As illustrated in FIG. 3E, the output signal of the addition unit 26 is a signal of the waveform resulted from adding by the addition circuit 42 the output signal of the inverted signal high frequency emphasizing circuit 20 having the amplitude adjusted by, e.g., ½ as illustrated in FIG. 3D to the output signal of the main driver 14 illustrated in FIG. 3A. Thus, the driver circuit 10 according to the present embodiment, in the low frequency emphasizing operation, adds the output signal of the inverted signal high frequency emphasizing circuit 20 having the amplitude adjusted by the addition circuit 24 to the output signal of the main driver 14, thereby generating a low frequency emphasized signal of the waveform of the output signal of the main driver 14 where an edge is rounded and its amplitude is decreased.

The driver circuit 10 according to the present embodiment is characterized mainly in that the variable capacity condensers 32, 38 are used as the condensers included in the non-inverted signal high frequency emphasizing circuit 18 and the inverted signal high frequency emphasizing circuit 10. In this example of circuit structure, the non-inverted signal high frequency emphasizing circuit 18 and the inverted signal high frequency emphasizing circuit 20, as will be described later, are formed by a common RC differentiating circuit, and a common variable capacity condenser is used as the variable capacity condensers 32, 38.

The capacity of the variable capacity condensers 32, 38 is varied, whereby the time constant of the RC differentiating circuit forming the non-inverted signal high frequency emphasizing circuit 18 and the inverted signal high frequency emphasizing circuit 20 can be controlled. Thus, the waveform of the differential signal to be outputted from the non-inverted signal high frequency emphasizing circuit 18 and the inverted signal high frequency emphasizing circuit 20 can be arbitrarily shaped. The driver circuit 10 according to the present embodiment generates a high frequency emphasized signal or a low frequency emphasized signal as an output signal by adding the differential signal shaped in an arbitrary waveform to an output signal of the main driver 14.

Thus, the driver circuit 10 according to the present embodiment can generate the high frequency emphasized signal as an output signal in the high frequency emphasizing operation with an arbitrary shape and can generate the low frequency emphasized signal as an output signal in the low frequency emphasizing operation with an arbitrary waveform by the simple circuit structure without making the circuit structure complicated and large. Thus, the driver circuit 10 according to the present embodiment can simulate an arbitrary transmission loss.

The driver circuit 10 according to the present embodiment controls the time constant of the RC differentiating circuit forming the non-inverted signal high frequency emphasizing circuit 18 and the inverted signal high frequency emphasizing circuit 20 by the variable capacity condensers 32, 38 in place of variable resistors. Accordingly, no gain change takes place by the control of the time constant of the RC differentiating circuit.

In such driver circuit 10 according to the present embodiment, when usual condensers whose capacities are invariable are used in place of the variable capacity condensers 32, 28, the time constant of the RC differentiating circuit is fixed, and an arbitrary transmission loss cannot be simulated.

In such case, for simulating transmission losses due to various loss conditions, plural sets of the sub drivers, the non-inverted signal high frequency emphasizing circuit, the inverted signal high frequency emphasizing circuit, the multiplying circuit and the addition circuit have to be incorporated, and the resistance values of the resistors and the capacity values of the condensers must be so set that the RC differentiating circuits forming the non-inverted signal high frequency emphasizing circuit and the inverted signal high frequency emphasizing circuit of the respective sets have time constants different from one another.

FIG. 4 is a block diagram of the driver circuit 44 including plural sets of the sub drivers, etc. with the usual condensers 33, 39 whose capacities are invariable provided in place of the variable capacity condensers 32, 38.

As illustrated, associated with respective plural sub-drives 16-1, . . . , 16-n, plural non-inverted signal high frequency emphasizing circuits 18-1, . . . , 18-n and plural inverted signal high frequency emphasizing circuits 20-1, . . . , 20-n are provided.

Associated with the respective plural non-inverted signal high frequency emphasizing circuits 18-1, . . . , 18-n, plural multiplying circuits 22-1, . . . , 22-n are provided. Associated with the plural inverted signal high frequency emphasizing circuits 20-1, . . . , 20-n, plural multiplying circuits 24-1 . . . , 24-n are provided.

In the addition unit 26, associated with the respective plural multiplying circuits 22-1, . . . , 22-n, plural addition circuits 40-1, . . . , 40-n are provided. Associated with the plural multiplying circuits 24-1, . . . , 24-n, plural addition circuits 42-1, . . . , 42-n are provided.

The plural non-inverted signal high frequency emphasizing circuits 18-1, . . . , 18-n each comprise an RC differentiating circuit including resistors 28, 30 and a usual condenser 33 whose capacity is invariable, and the resistance values of the resistors 28, 30 and the capacity value of the condenser 33 of the respective RC differentiating circuits are different so that the time constants of the RC differentiating circuits are different. The plural inverted signal high frequency emphasizing circuits 20-1, . . . , 20-n RC differentiating circuits each comprising resistors 34, 36 and a usual condenser 39 whose capacity is invariable, and the resistance values of the resistors 34, 36 and the capacity value of the condenser 39 of the respective RC differentiating circuits are different so that the time constant of the RC differentiating circuits are different.

Thus, to simulating transmission losses due to various loss conditions with the usual (fixed capacity) condensers 33, 39 used in place of the variable capacity condensers 32, 38, plural RC differentiating circuits of time constants different from each other must be prepared. Accordingly, the circuit becomes complicated and large. Furthermore, to simulate arbitrary transmission losses, infinite number of the RC differentiating circuits whose time constants are different from each other must be prepared. Thus, the use of the usual condensers 33, 39 makes it actually impossible to simulate arbitrary transmission losses.

The driver circuit 10 according to the present embodiment, however, as described above, uses the variable capacity condensers 32, 38 in the RC differentiating circuit forming the non-inverted signal high frequency emphasizing circuit 18 and the inverted signal high frequency emphasizing circuit 20, which allows the time constant of the RC differentiating circuit to be suitably adjusted thereby freely simulating the transmission losses by the simple circuit structure without making the circuit structure complicated and large.

Next, the specific circuit structure of the driver circuit 10 according to the present embodiment will be explained with reference to FIGS. 5 and 6.

As illustrated in FIG. 5, the main driver 14 comprises two transistors 46, 48, two transistors 50, 52 having the emitters connected respectively to the collectors of the two transistors 46, 48, two resistors 54; 56 as load resistances respectively connected to the collectors of the two transistors 50, 52, and a constant-current circuit 58 commonly connected to the emitters of the two transistors 46, 48.

The sub driver 15 comprises two transistors 60, 62, and constant-current circuits 64, 66 respectively connected to the emitters of the two transistors 60, 62.

The non-inverted signal high frequency emphasizing circuit 18 and the inverted signal high frequency emphasizing circuit 20 are a common RC differentiating circuit comprising resistors 28, 30 (34, 36) serially connected between the emitter side of the transistor 60 of the sub driver 16 and the emitter side of the transistor 62 of the sub driver 16, and variable capacity condensers 32 (38). The non-inverted signal high frequency emphasizing circuit 18 and the inverted signal high frequency circuit 20 are thus a common RC differentiating circuit, which makes it possible to realize the low frequency emphasis and the high frequency emphasis of signals without the need of making the circuit structure complicated and large. The RC differentiating circuit does not essentially include two resistors and may include either of the resistors 28, 30 and the resistors 34, 36.

The multiplying circuit 22 comprises two transistors 68, 70 having the emitters connected to the transistor 62 of the sub driver 16. The multiplying circuit 24 comprises two transistors 72, 74 having the emitters connected to the collector of the transistor 60 of the sub driver 16.

A drive power source 76 is connected to the bases of the transistors 50, 52 of the main driver 14. A drive power source 78 is connected to the resistors 54, 56 of the main driver 14.

FIG. 6 illustrates an example of structure of the RC differentiating circuit which is common between the non-inverted signal high frequency emphasizing circuit 18 and the inverted signal high frequency emphasizing circuit 20 of the above described circuit structure illustrated in FIG. 5.

As illustrated, the RC differentiating circuit comprises the resistors 28 (34), the variable capacity condensers 32 (38) and the resistors 30 (36) which are serially connected.

The variable capacity condenser 32 (38) is a variable capacity diode (varicap or varactor) 80, 82 having the cathodes connected to each other. The anode of the variable capacity diode 80 is connected to the resistor 28 (34), and the anode of the variable capacity diode 82 is connected to the resistor 30 (36). To the cathodes of the variable capacity diodes 80, 82, a control voltage $V_{cont}$ for controlling the capacities is applied from an outside terminal. The inverse bias applied to the variable capacity diodes 80, 82 is controlled by the control voltage $V_{cont}$ to thereby change the anode-cathode capacities of the variable capacity diodes 80, 82. Thus, the time constant of the RC differentiating circuit which is commonly used between the non-inverted signal high frequency emphasizing circuit 18 and the inverted signal high frequency emphasizing circuit 20 can be controlled. Since the time constant of the RC differentiating circuit is thus freely adjusted, the differentiated signal generated by the RC differentiating circuit can be shaped in arbitrary waveforms.

In the main driver 14, a signal PAT generated by the signal generating unit 12 is inputted to the base of one of the transistors. To the base of the other transistor 48, a signal of a prescribed reference voltage $V_{ref1}$ (PATB) is inputted. Thus, from the collector of the other transistor 48, a signal of the same waveform as that of the signal inputted to the base of one transistor 46 is outputted, and the signal outputted from the collector of the transistor 48 is outputted as an output signal of the main driver 14 via a transistor 52.

In the sub driver 16, as in the main driver 14, to the base of one transistor 60 the signal PAT generated by the signal generating unit 12 is inputted. To the base of the other transistor 62, a signal of the prescribed reference voltage $V_{ref1}$ (PATB) is inputted.

Thus, a signal of the inverted waveform of the signal inputted to the base of the transistor 60 is outputted from the collector of one transistor 60. The signal to be outputted from the collector of the transistor 60 has the high frequency emphasized by the inverted signal high frequency emphasizing circuit 20 formed in the RC differentiating circuit, and the high frequency component alone of above a cut off frequency determined by element constants of them. The capacities of the variable capacity condensers 38 (32) are suitably adjusted, whereby a differentiated signal to be outputted from the collector of the transistor 60 can be shaped in an arbitrary waveform.

The signal outputted from the collector of the transistor 60 is inputted to the multiplying circuit 24.

From the collector of the other transistor 62, a signal of the same waveform as that of the signal inputted to the base of one transistor 60 is outputted. The signal to be outputted from the collector of the transistor 62 has the high frequency emphasized by the non-inverted signal high frequency emphasizing circuit 18 in the form of the RC differentiating circuit comprising the resistors 28, 30 (34, 36) and the variable capacity condensers 32 (38), and the high frequency component alone of above a cut off frequency determined by element constants of them is outputted. The capacities of the variable capacity condensers 32 (38) are here suitably adjusted to thereby shape a differentiated signal to be outputted from the collector of the transistor 62 in an arbitrary waveform.

The signal outputted from the collector of the transistor 62 is inputted to the multiplying circuit 22.

In the multiplying circuit 22, the signal outputted from the collector of the transistor 62 is inputted to the emitter sides of a transistor 68 and a transistor 70. To the base of one transistor 68, a signal of a prescribed voltage $V_{mag1}$ is inputted. To the base of the other transistor 70, a signal of a prescribed reference voltage $V_{ref2}$ is inputted. Thus, from the collector of the other transistor 68, a signal of an adjusted amplitude of the signal outputted from the collector of the transistor 62 is outputted.

The signal outputted from the collector of the transistor 68 of the multiplying circuit 22 is added to the output signal of the main driver 14 by the addition circuit 40.

In the multiplying circuit 24, the signal outputted from the collector of the transistor 60 is inputted t the emitter sides of a transistor 72 and a transistor 74. Here, to the base of one transistor 72, a signal of a prescribed voltage $V_{mag2}$ is inputted. To the base of the other transistor 72, a signal of a prescribed reference voltage $V_{ref2}$ is inputted. Thus, from the collector of one transistor 72, a signal of an adjusted amplitude of the signal outputted from the collector of the transistor 60 is outputted.

The signal outputted from the collector of the multiplying circuit 24 is added to the output signal of the main driver 14 by the addition circuit 42.

In the high frequency emphasizing operation for outputting a high frequency emphasized signal as an output signal $V_{out}$ of the driver circuit 10, the signal outputted from the collector of the transistor 60 is nullified by the multiplying circuit 24 to become zero, and thereby only the output signal of the multiplying circuit 22 is added to the output signal of the main driver 14. In the multiplying circuit 22, the voltage $V_{mag1}$ of the signal to be inputted to the base of the transistor 68 is changed, where the emphasis magnitude of the high frequency emphasized signal can be changed.

In the low frequency emphasizing operation, in which a low frequency emphasized signal is outputted as an output signal $V_{out}$ of the driver circuit 10, the signal outputted from the collector of the transistor 62 is nullified by the multiplying circuit 22 to become zero, and thereby only the output signal of the multiplying circuit 24 is added to the output signal of the main driver 14. In the multiplying circuit 24, the voltage $V_{mag2}$ of the signal to be inputted to the base of the transistor 72 is changed, whereby the emphasis magnitude of the low frequency emphasized signal can be varied.

As described above, according to the present embodiment, a required high frequency emphasized signal of an arbitrary waveform and a low frequency emphasized signal of an arbitrary waveform, by the simple circuit structure without the need of a complicated and large circuit structure, can be generated and can simulate arbitrary transmission losses.

In the above example, as the variable capacity condensers (38), the variable capacity diodes 80, 82 are used. However, the variable capacity condensers 32 (38) are not limited to such diodes and can be e.g., transistors.

Figure 7:
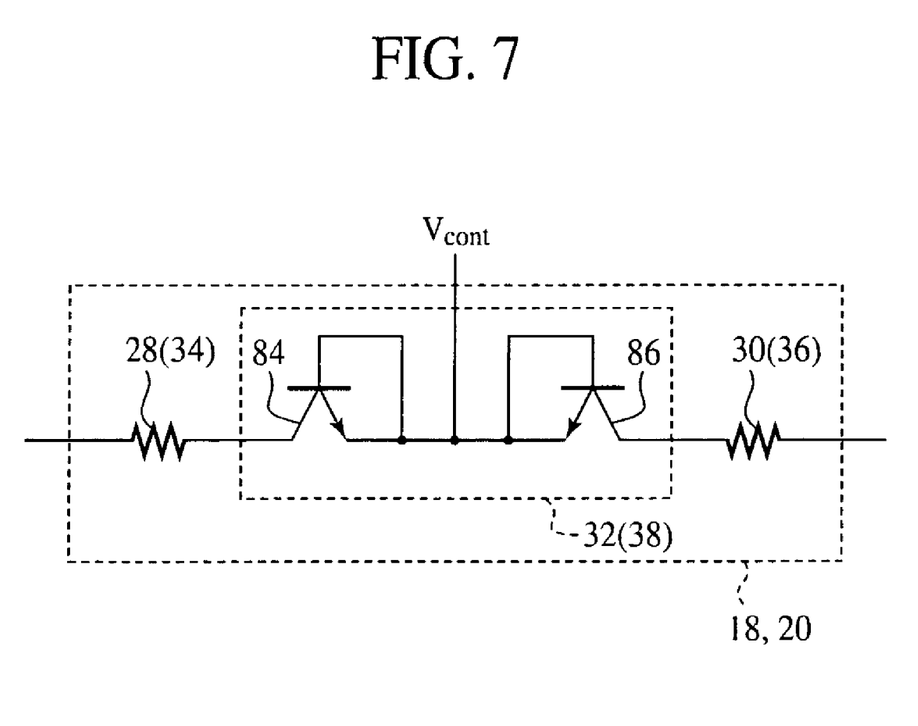
FIG. 7 is a circuit diagram illustrating the structure of an RC differentiating circuit of the driver circuit according to a modification of the embodiment of the present invention, which is common between the non-inverted signal high frequency emphasizing circuit and the inverted signal high frequency emphasizing circuit.

FIG. 7 is a circuit diagram of the structure of an RC differentiating circuit using transistors as the variable capacity condensers 32 (38) of the RC differential circuit.

As illustrated, the RC differentiating circuit comprises resistors 28 (34), variable capacity condensers 32 (38) and resistor 30 (36).

The variable capacity condensers 32 (38) are 2 transistors 84, 86 having the emitters connected to each other. The collector of the transistor 84 is connected to the resistors 28 (34), and the collector of the transistor 86 is connected to the resistors 30 (36). To the emitters and the bases of the transistors 84, 86, a control voltage $V_{cont}$ for controlling the capacities is applied from an outside terminal. The control voltage $V_{cont}$ controls the base-collector capacities of the transistors 84, 86, i.e., the capacities of the variable capacity condensers 32 (36). Thus, the time constant of the RC differentiating circuit which is commonly used between the non-inverted signal high frequency emphasizing circuit 18 and the inverted signal high frequency emphasizing circuit 20 can be controlled. Since the time constant of the RC differentiating circuit is thus freely adjusted, the differential signal generated by the RC differentiating circuit can be shaped in an arbitrary waveform.

Modified Embodiments

The present invention is not limited to the above-described embodiment and can cover other various modifications.

For example, in the above-described embodiment, rectangular waveform pulse signals are supplied to the driver circuit by the signal generating unit 12. However, signals to be supplied to the driver circuit by the signal generating unit 12 can be various signals, such as triangular waveform pulse signals, etc.

In the above-described embodiment, the main driver 14 generates output signals of the same waveform as that of the input signals. However, the main driver 14 may output non-inverted signals of prescribed waveforms corresponding to the input signals.

In the above-described embodiment, the sub driver 16 outputs differential signals of non-inverted signals of the same waveforms as those of the input signals and inverted signals of the inverted waveforms of the input signals. However, the sub driver 16 may output differential signals of non-inverted signal and inverted signals of prescribed waveforms corresponding to the input signals.

In the above-described embodiment, the driver circuit includes the non-inverted signal high frequency emphasizing circuit 18 and the inverted signal high frequency emphasizing circuit 20, and can make both of the high frequency emphasizing operation and the low frequency emphasizing operation. However, the driver circuit may include either one of the non-inverted signal high frequency emphasizing circuit 18 and the inverted signal high frequency emphasizing circuit 20 and may conduct either one of the high frequency emphasizing operation and the low frequency emphasizing operation.

In the above-described embodiment, the driver circuit according to the present invention is used as a driver circuit of semiconductor test devices, for generating signals for testing DUTs. However, the present invention is applicable not only to driver circuits of semiconductor test devices, but also to driver circuits for supplying signals to any circuits connected to the driver circuits.

The driver circuit according to the present invention, by a simple circuit structure without the need of a complicated and large circuit structure, can generate required high frequency emphasized signals and low frequency emphasized signals and can simulate arbitrary transmission losses. Thus, the driver circuit according to the present invention is very useful for the accuracy improvement of test of DUTs by semiconductor test devices.

The invention claimed is:

1. A driver circuit for outputting an output signal of a waveform corresponding to an input signal, the driver circuit comprising:
   a main driver which receives said input signal and outputs a first signal corresponding to said input signal;
   a sub driver which receives said input signal and outputs a differential signal formed of a second signal corresponding to said input signal and a third signal produced by inverting said input signal;
   a differentiating circuit including a resistor which is connected in parallel with respect to an incoming signal and a variable capacity condenser which is connected in serial with respect to the incoming signal, the differentiating circuit outputting a fourth signal produced by differentiating the second signal and a fifth signal produced by differentiating the third signal; and
   an addition unit which selectively outputs as said output signal either one of a high frequency emphasized signal produced by adding the first signal and the fourth signal and a low frequency emphasized signal produced by adding the first signal and the fifth signal.

2. A driver circuit according to claim 1, wherein the variable capacity condenser is a diode.

3. A driver circuit according to claim 1, wherein the variable capacity condenser is a transistor.

4. A driver circuit for outputting an output signal of a waveform corresponding to an input signal, the driver circuit comprising:
   a main driver which receives said input signal and outputs a first signal corresponding to said input signal;
   a sub driver which receives said input signal and outputs a differential signal formed of a second signal corresponding to said input signal and a third signal produced by inverting said input signal;
   a first differentiating circuit including a first resistor which is connected in parallel with respect to an incoming signal and a first variable capacity condenser which is connected in serial with respect to the incoming signal, the first differentiating circuit outputting a fourth signal produced by differentiating the second signal;
   a second differentiating circuit including a second resistor which is connected in parallel with respect to an incoming signal and a second variable capacity condenser which is connected in serial with respect to the incoming signal, the second differentiating circuit outputting a fifth signal produced by differentiating the third signal;
   a first multiplying circuit which receives the fourth signal and outputs a sixth signal by multiplying the fourth signal with a first prescribed value;

a second multiplying circuit which receives the fifth signal and outputs a seventh signal by multiplying the fifth signal with a second prescribed value;

a first addition unit which outputs as said output signal a high frequency emphasized signal produced by adding the first signal and the sixth signal; and a second addition unit which outputs as said output signal a low frequency emphasized signal produced by adding the first signal and the seventh signal.

5. A driver circuit according to claim 4, wherein each of the first variable capacity condenser and the second variable capacity condenser is a diode.

6. A driver circuit according to claim 4, wherein each of the first variable capacity condenser and the second variable capacity condenser is a transistor.

\* \* \* \* \*